US006992892B2

(12) United States Patent
Moroz et al.

(10) Patent No.: US 6,992,892 B2
(45) Date of Patent: Jan. 31, 2006

(54) METHOD AND APPARATUS FOR EFFICIENT TEMPERATURE CONTROL USING A CONTACT VOLUME

(75) Inventors: Paul Moroz, Marblehead, MA (US); Thomas Hamelin, Georgetown, MA (US)

(73) Assignee: Tokyo Electron Limited, Tokyo (JP)

( * ) Notice: Subject to any disclaimer, the term of this patent is extended or adjusted under 35 U.S.C. 154(b) by 68 days.

(21) Appl. No.: 10/670,292

(22) Filed: Sep. 26, 2003

(65) Prior Publication Data

US 2005/0068736 A1 Mar. 31, 2005

(51) Int. Cl.
*H05K 7/20* (2006.01)
*H01L 23/34* (2006.01)

(52) U.S. Cl. ...................... 361/704; 361/709; 361/710; 361/711; 361/702; 257/714

(58) Field of Classification Search ................ 361/704, 361/688–690, 697, 699, 700, 702, 703, 709–711, 361/717–720; 257/712–722, E33.075, E31.131, 257/E23.08–E23.082, 930
See application file for complete search history.

(56) References Cited

U.S. PATENT DOCUMENTS 5,268,812 A * 12/1993 Conte ......................... 361/698
5,323,292 A * 6/1994 Brzezinski .................. 361/689
5,458,189 A * 10/1995 Larson et al. .......... 165/104.33
5,615,086 A * 3/1997 Collins et al. ............. 361/704
5,659,458 A * 8/1997 Patchen ...................... 361/704
5,720,338 A * 2/1998 Larson et al. ................. 165/46
5,880,524 A * 3/1999 Xie ............................ 257/704
5,907,474 A * 5/1999 Dolbear ...................... 361/705
5,957,547 A * 9/1999 Schliebe et al. ......... 303/119.3
6,133,631 A * 10/2000 Belady ....................... 257/714
6,212,074 B1 * 4/2001 Gonsalves et al. .......... 361/717
6,474,074 B2 * 11/2002 Ghoshal ........................ 62/3.7
6,504,720 B2 * 1/2003 Furuya ....................... 361/699
6,550,263 B2 * 4/2003 Patel et al. ................ 62/259.2
6,550,531 B1 * 4/2003 Searls et al. ........... 165/104.33
6,665,187 B1 * 12/2003 Alcoe et al. ................ 361/719
6,681,482 B1 * 1/2004 Lischner et al. .............. 29/840

* cited by examiner

*Primary Examiner*—Anatoly Vortman
(74) *Attorney, Agent, or Firm*—Oblon, Spivak, McClelland, Maier & Neustadt, P.C.

(57) ABSTRACT

A substrate holder for supporting a substrate, including an exterior supporting surface, a cooling component, a heating component positioned adjacent to the supporting surface and between the supporting surface and the cooling component, and a contact volume positioned between the heating component and the cooling component, and formed by a first internal surface and a second internal surface. The thermal conductivity between the heating component and the cooling component is increased when the contact volume is provided with a fluid.

24 Claims, 4 Drawing Sheets

METHOD AND APPARATUS FOR EFFICIENT TEMPERATURE CONTROL USING A CONTACT VOLUME

BACKGROUND OF THE INVENTION

1. Field of the Invention

The present invention is generally related to semiconductor processing systems and, more particularly, to temperature control of a substrate using rough contact or micron-size gaps in a substrate holder.

2. Discussion of the Background

Many processes (e.g., chemical, plasma-induced, etching and deposition) depend significantly on the instantaneous temperature of a substrate (also referred to as a wafer). Thus, the capability to control the temperature of a substrate is an essential characteristic of a semiconductor processing system. Moreover, fast application (in some important cases, periodically) of various processes requiring different temperatures within the same vacuum chamber requires the capability of rapid change and control of the substrate temperature. One method of controlling the temperature of the substrate is by heating or cooling a substrate holder (also referred to as a chuck). Methods to accomplish faster heating or cooling of the substrate holder have been proposed and applied before, but none of the existing methods provide rapid enough temperature control to satisfy the growing requirements of the industry.

For example, flowing liquid through channels in the chuck is one method for cooling substrates in existing systems. However, temperature of the liquid is controlled by a chiller, which is usually located at a remote location from the chuck assembly, partially because of its noise and size. However, the chiller unit is often very expensive and is limited in its capabilities for rapid temperature change due to the significant volume of the cooling liquid and to limitations on heating and cooling power provided by the chiller. Moreover, there is an additional time delay for the chuck to reach a desired temperature setting, depending mostly on the size and thermal conductivity of the chuck block. These factors limit how rapidly the substrate can be cooled to a desired temperature.

Other methods have also been proposed and used, including the use of an electric heater embedded in a substrate holder to affect heating of the substrate. The embedded heater increases the temperature of the substrate holder, but the cooling thereof is still dependent on cooling liquid controlled by a chiller. Also, the amount of power that can be applied to the embedded heater is limited, as the chuck materials in direct contact with the embedded heater may be permanently damaged. The temperature uniformity on an upper surface of the substrate holder is also an essential factor and further limits the rate of heating. All of these factors place limits on how rapidly a temperature change of a substrate can be accomplished.

BRIEF SUMMARY OF THE INVENTION

Accordingly, one object of the present invention is to solve or reduce the above-described or other problems with conventional temperature c Another object of the present invention is to provide a method and system for providing faster heating a cooling of a substrate.

These and/or other objects of the present invention may be provided by a method and apparatus for rapid temperature change and control of an upper part of a substrate holder that supports a substrate during chemical and/or plasma processing.

In accordance with a first aspect of the present invention, a substrate holder for supporting a substrate is provided. The substrate holder includes an exterior supporting surface, a cooling component, a heating component positioned adjacent to the supporting surface and between the supporting surface and the cooling component. A contact volume is positioned between the heating component and the cooling component, and is formed by a first internal surface and a second internal surface. The thermal conductivity between the heating component and the cooling component is increased when the contact volume is provided with a fluid.

In accordance with a second aspect of the present invention, a substrate processing system is provided. The system includes a substrate holder for supporting a substrate, including an exterior supporting surface, a cooling component including a cooling fluid, a heating component positioned adjacent to the supporting surface and between the supporting surface and the cooling component, and a contact volume positioned between the heating component and the cooling component, and formed by a first internal surface and a second internal surface. The system also includes a fluid supply unit connected to the contact volume. The fluid supply unit is arranged to supply a fluid to the contact volume and to remove the fluid from the contact volume.

In accordance with a third aspect of the present invention, a substrate holder for supporting a substrate is provided. The substrate holder includes an exterior supporting surface, a cooling component, and a heating component positioned adjacent to the supporting surface and between the supporting surface and the cooling component. The substrate holder also includes first means for effectively reducing a thermal mass of the substrate holder to be heated by the heating component and for increasing thermal conductivity between a portion of the substrate holder surrounding the heating component and a portion of the substrate holder surrounding the cooling component.

In accordance with a fourth aspect of the present invention, a method for manufacturing a substrate holder is provided. The method includes providing an external supporting surface, polishing a first internal surface and/or a second internal surface, connecting peripheral portions of the first internal surface and of the second internal surface to form a contact volume, and providing a heating component and a cooling component on opposite sides of the contact volume.

In accordance with a fifth aspect of the present invention, a method of controlling a temperature of a substrate holder is provided. The method includes increasing the temperature of the substrate holder, the increasing step including activating a heating component, and effectively reducing a thermal mass of the substrate holder to be heated by the heating component. The method also includes decreasing the temperature of the supporting surface, the decreasing step including activating a cooling component, and increasing a thermal conductivity between the heating component and the cooling component.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
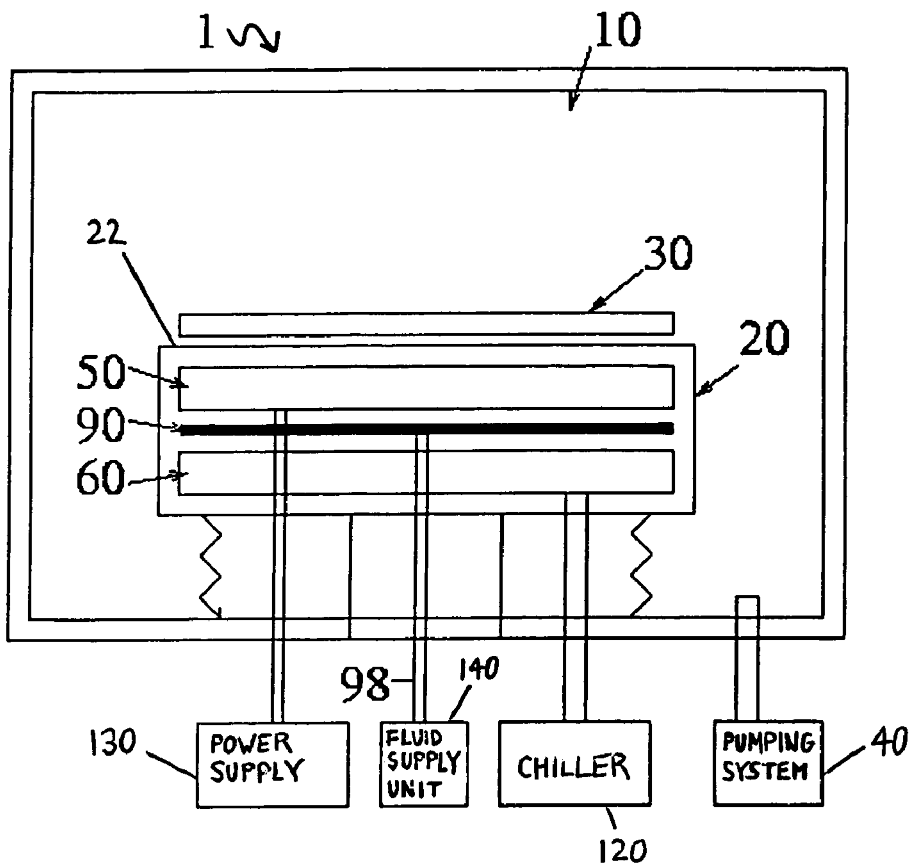
FIG. 1 is a schematic view a semiconductor processing apparatus in accordance with an exemplary embodiment of the present invention.

Referring now to the drawings, where like reference numeral designations identify the same or corresponding parts throughout the several views, several embodiments of the present invention are next described.

FIG. 1 illustrates a semiconductor processing system 1, which can be used for chemical and/or plasma processing, for example. The processing system 1 includes a vacuum processing chamber 10, a substrate holder 20 having a supporting surface 22, and a substrate 30 that is supported by substrate holder 20. The processing system 1 also includes a pumping system 40 for providing a reduced pressure atmosphere in the processing chamber 10, an embedded electric heating component 50 fed by a power supply 130, and an embedded cooling component 60 with channels for a liquid flow controlled by a chiller 120. A contact volume 90 is provided between the heating component 50 and the cooling component 60. A fluid supply unit 140 is provided to supply and remove a fluid 92 from the contact volume 90 via the conduit 98 to facilitate heating and cooling of the substrate holder 20. As a non-limiting example, the fluid 92 can be helium (He) gas or, alternatively, any other fluid capable of rapidly and significantly increasing or decreasing the heat conductivity across contact volume 90.

Figure 2:
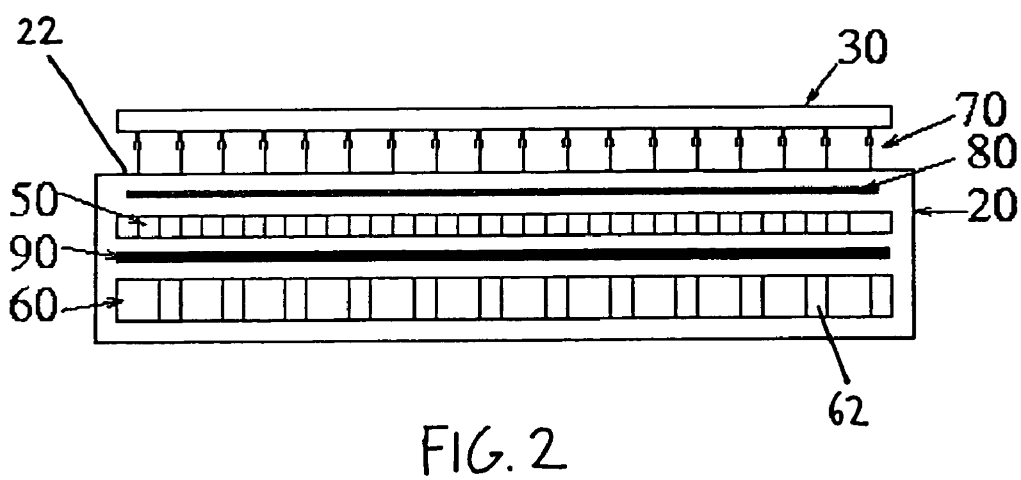
FIG. 2 is a cross-section view of the substrate holder of FIG. 1.

FIG. 2 shows additional details of the substrate holder 20 in relation to the substrate 20. As seen in this figure, the helium backside flow 70 is provided from a He supply (not shown) for enhanced thermal conductivity between the substrate holder 20 and the substrate 30. The enhanced thermal conductivity ensures that rapid temperature control of the supporting surface 22, which includes or is directly adjacent to the heating component 50, leads to rapid temperature control of the substrate 30. Grooves on the surface 22 can also be used for faster He gas distribution. As also seen in FIG. 2, the cooling component 60 includes a plurality of channels 62 arranged to contain liquid flow controlled by the chiller 120, and the substrate holder 20 can include an electrostatic clamping electrode 80 and a corresponding DC power supply and connecting elements required to provide electrostatic clamping of substrate 30 to substrate holder 20.

It is to be understood that the system shown in FIGS. 1 and 2 is exemplary only and that other elements may be included. For example, the processing system 1 can also include a RF power supply and an RF power feed, pins for placing and removing the wafer, a thermal sensor, and any other elements known in the art. The processing system 1 can also include process gas lines entering the vacuum chamber 10, and a second electrode (for a capacitively-coupled-type system) or an RF coil (for an inductively-coupled-type system), for exciting the gas in the vacuum chamber 10 into a plasma.

Figure 3:
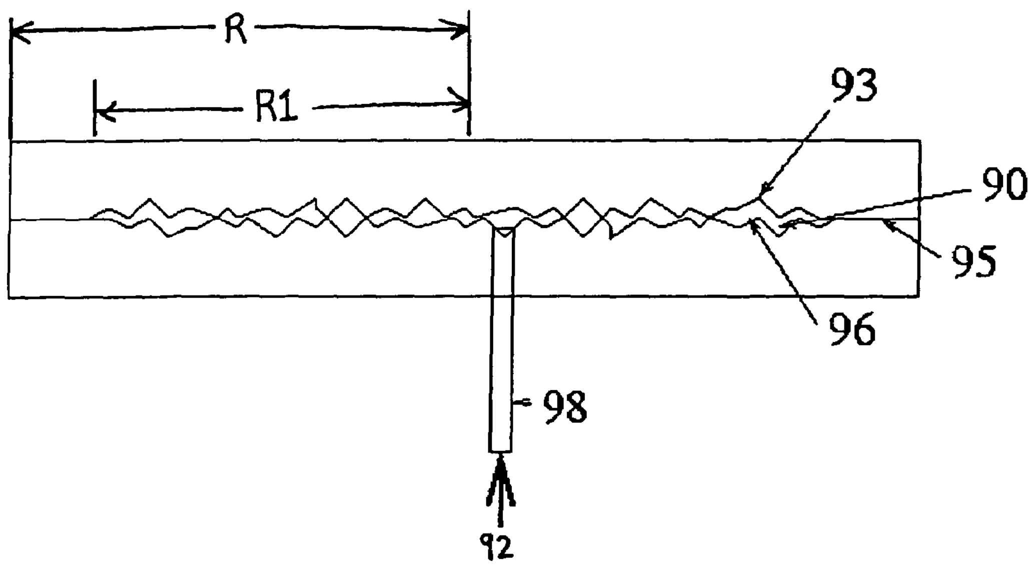
FIG. 3 is a schematic view of the contact between two internal rough surfaces inside the substrate holder of FIG. 1.

FIG. 3 shows the details of the contact volume 90 according to one embodiment of the present invention. As seen in FIG. 3, the contact volume 90 is provided between an upper internal surface 93 and a lower internal surface 96 of substrate holder 20. In this example, the contact volume 90 is arranged as a rough contact between two rough surfaces 93 and 96. As shown in FIGS. 1 and 2, each of surfaces 93 and 96 has a surface area substantially equal to the operating surface areas of heating component 50 and cooling component 60. Alternatively, the surface areas of the surfaces 93 and 96 can be greater or smaller than the surface areas of the heating component 50 and the cooling component 60, but the resulting contact volume 90 should be of a size facilitating rapid heating and cooling of the supporting surface 22. Also, preferably, the supporting surface 22, an operating surface of the cooling component 60, an operating surface of the heating component 50, the upper surface 93, and the lower surface 96 can be substantially parallel to one another, although they need not be. For purposes of this document, "substantially equal" and "substantially parallel" respectively refer to a condition where any deviations from complete equality or complete parallelism are within a permitted range as recognized in the art. The preparation steps for obtaining the rough surface areas of the surfaces 93 and 96 can be as follows or, alternatively, by any other method known in the art for surface roughening.

First, the surfaces 93 and 96 are both polished everywhere in an area defined by radius R, where R is the full radius of the substrate holder (or through the full size, if it is not circular). Then, some techniques for surface roughening (e.g., sand blasting) are applied to an inner area of the surfaces defined by a radius R1 (in the case of circular geometry), where R1 is a radius slightly less than R, so only a relatively small periphery strip 95 is left as polished. Then, the upper and lower blocks corresponding to the upper surface 93 and the lower surface 96 are connected, which results in good mechanical contact at the periphery strip 95, while leaving the contact volume 90 as being a rough contact of the surfaces 93 and 96.

The idea of the rough contact is to significantly reduce the heat conductivity across contact volume 90, while keeping surfaces 93 and 96 very close (i.e., within a range of a few microns; preferably, in the range of 1–20 microns) to each other. In the FIG. 3 embodiment, surfaces 93 and 96 can be in contact with each other at some areas including surface irregularities, but are in most places separated. With this configuration, the thermal conductivity across contact volume 90 is reduced by an order of magnitude or more.

As described above, the example shown in FIG. 3 illustrates a contact volume 90 that is formed by two surfaces 93 and 96 that have each been polished and subsequently roughened. In an alternative embodiment, only one of the surfaces 93 and 96 is roughened, such that the contact volume is formed by a polished surface on one side and a roughened surface on the opposite side. In this configuration, a rough contact is still achieved.

Figure 4:
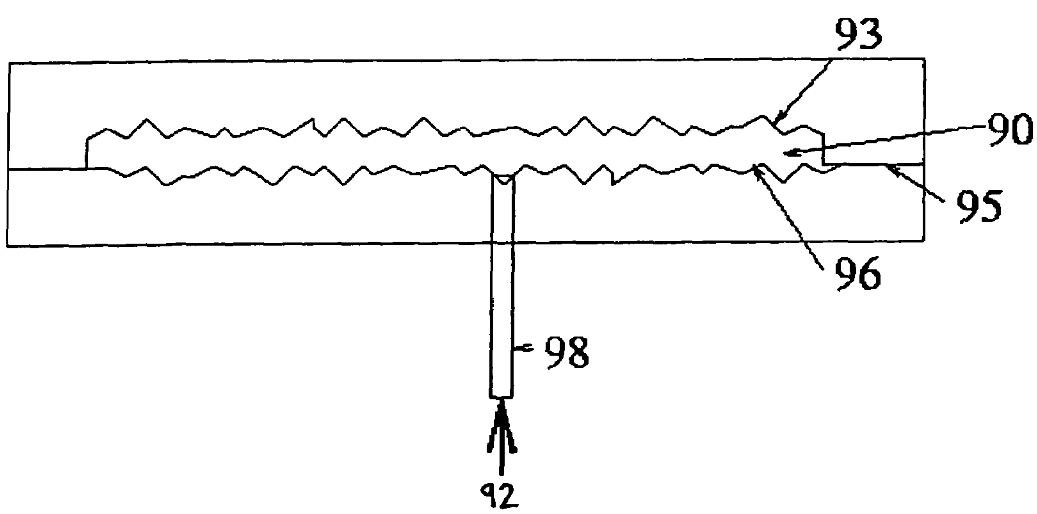
FIG. 4 is a schematic view of a contact volume between two internal rough surfaces inside the substrate holder of FIG. 1 in accordance with a further embodiment of the present invention.
Figure 5:
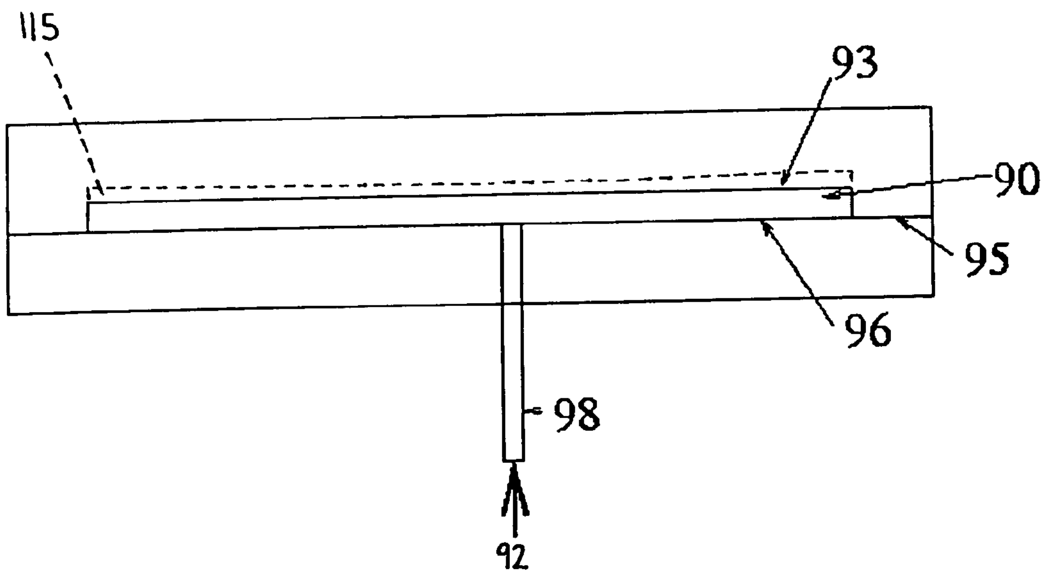
FIG. 5 is a schematic view of a contact volume between two internal smooth surfaces inside the substrate holder of FIG. 1 in accordance with another embodiment of the present invention.

As another alternative to the embodiment illustrated in FIG. 3, the contact volume 90 can be formed by the upper surface 93 and the lower surface 96 such that these surfaces to not contact each other at all. This configuration is shown in FIG. 4, where the surfaces 93 and 96 are separated from each other by a small amount of space, i.e., where the distance across the contact volume 90 between the surfaces 93 and 96 is a few microns. Preferably, the distance across the contact volume 90 is between 1 micron and 50 microns, and, more preferably, between 1 micron and 20 microns. The surfaces 93 and 96 can be roughened (as shown in FIG. 4) to increase the surface area and modify interaction of fluid 92 with the surfaces 93 and 96. As shown in the further alternative embodiment of FIG. 5, the surfaces 93 and 96 can both be smooth, while separated by a small amount of space, as in the embodiment of FIG. 4. In both of these examples, the distance across the contact volume 90 between the surfaces 93 and 96 should be dimensioned such that the thermal conductivity of the contact volume 90 can be changed dramatically and in a controllable fashion by the introduction and evacuation of the fluid 92. In the example of using pressurized He gas as the fluid 92, this distance is preferably between 1 micron and 50 microns, and, more preferably, between 1 micron and 20 microns.

Figure 6:
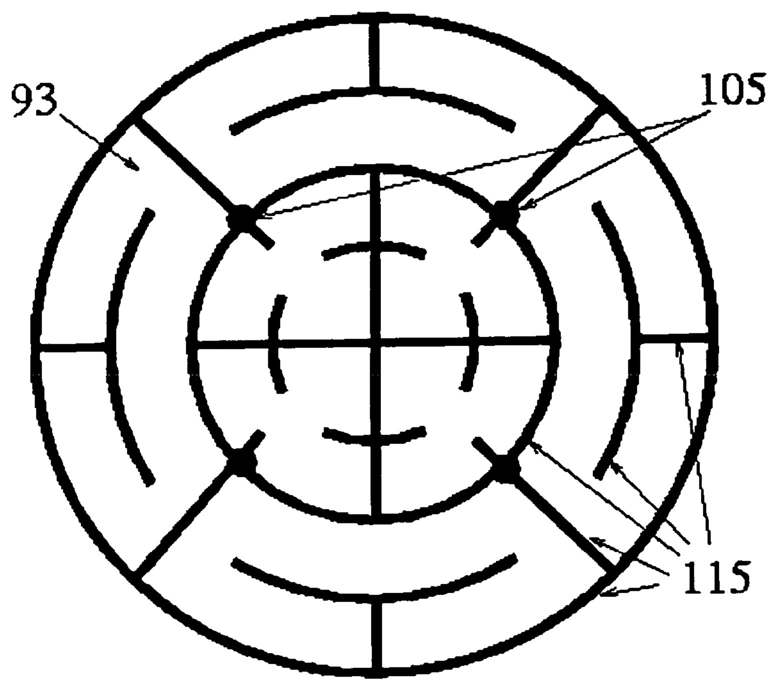
FIG. 6 is a plan view of an exemplary single-zone groove pattern on an internal surface of FIG. 5.

FIG. 6 illustrates a single-zone groove system including ports 105 and grooves 115, the combination of which is provided to improve rapid distribution of the fluid 92 within the contact volume 90. Ports 105 can be positioned on the upper surface 93 (as shown in FIG. 6) and/or the lower surface 96. The fluid 92 is supplied to the contact volume 90 through the conduit 98 and through ports 105. Grooves 115 can also be positioned on the upper surface 93 (e.g., the smooth upper surface 93 of the embodiment shown in phantom in FIG. 5) and/or on the lower surface 96. When grooves 115 are positioned in both surfaces 93 and 96, they can be identically configured and aligned opposite to each other or shifted relative to each other. Alternatively, each set of grooves 115 can be differently configured such that they do not align when surfaces 93 and 96 are brought together. Grooves 115 can have a width of about 0.2 mm to 2.0 mm and a depth of the same dimension range. Thermal conductivity within the contact volume 90 depends on the pressure of the fluid 92 in a zone (e.g. area) covered by grooves 115, a condition that allows thermal conductivity profile control, and therefore temperature profile control over surfaces 93 and 96.

Figure 7:
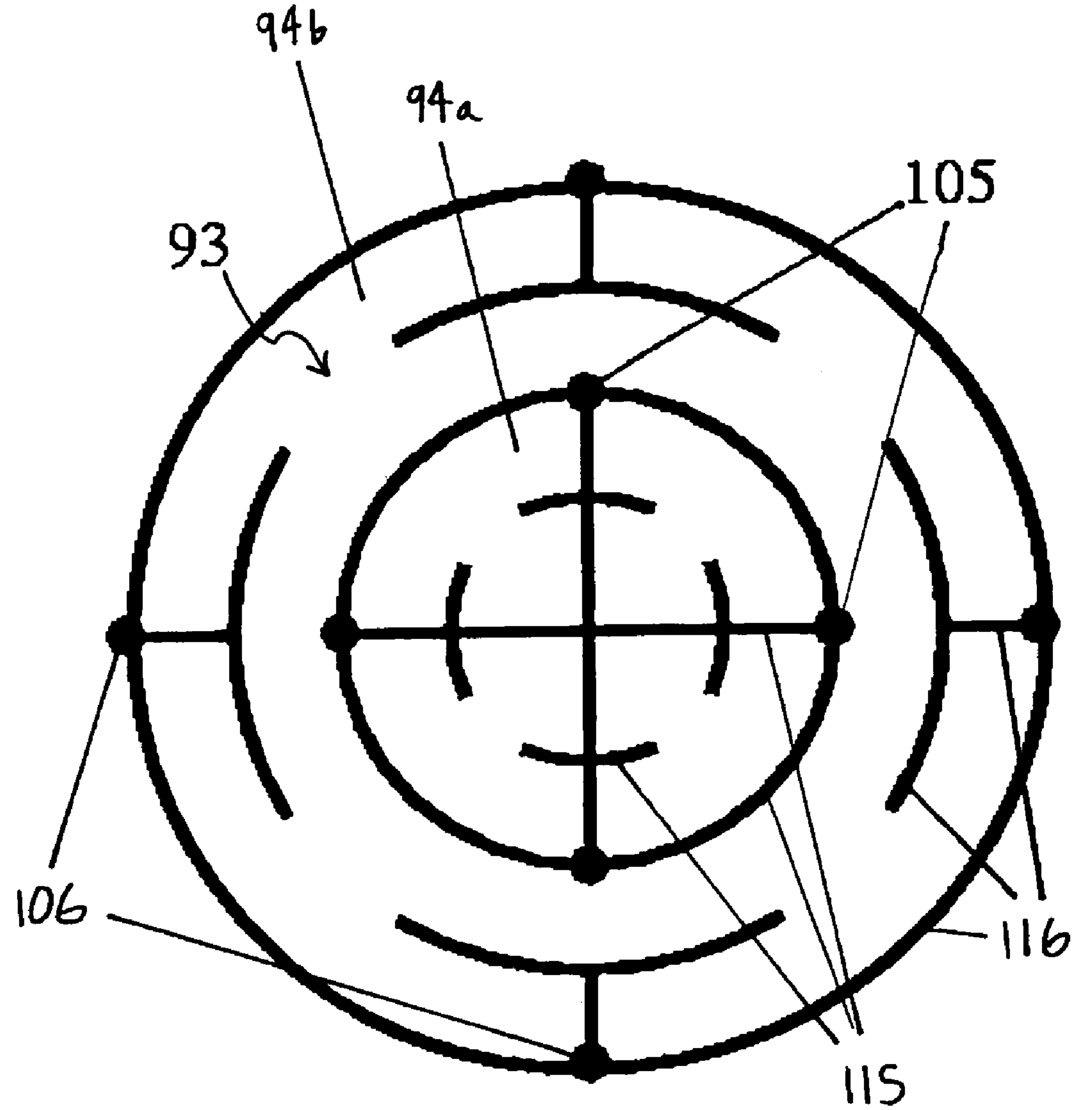
FIG. 7 is a plan view of an exemplary dual-zone groove pattern on an internal surface of FIG. 5.

Alternatively to the single-zone system shown in FIG. 6, FIG. 7 illustrates a dual-zone system in which a first zone 94*a* includes and is formed by inner grooves 115 and inner ports 105, and a second zone 94*b* includes and is formed by outer grooves 116 and outer ports 106. The inner grooves 115 govern the pressure, thermal conductivity, and temperature in the first zone 94*a* of the substrate holder, while the outer grooves 116 govern these conditions in the second zone 94*b*. Grooves 115 do not connect with grooves 116 at any point on the surface 93, creating a configuration that facilitates separate control of different zones of a contact volume. Further, a multi-zone groove system (not shown) can be provided, in which case a separate set of fluid ports is provided to each zone and different gas pressures can be used for different zones. Moreover, grooves 115 and ports 105 can alternatively be configured in any other manner to obtain a desired fluid distribution in contact volume 90. For example, a 3-zone contact volume can include inner grooves, mid-radius grooves, and outer grooves, with independently controlled pressures of fluid 92.

The various embodiments of the present invention can be operated as follows. During a heating phase, the heating component 50 is powered, while the fluid 92 is evacuated from the contact volume 90 and transferred into the fluid supply unit 140. In this way, the heat conductivity across the contact volume 90 is greatly decreased such that the contact volume 90 acts as a heat barrier. That is, the evacuation step effectively separates the portion of the substrate holder 20 directly surrounding the cooling component 60 from the portion of the substrate holder 20 directly surrounding the heating component 50. Thus, the mass of the substrate holder 20 to be heated by the heating component 50 is effectively reduced to only the portion of the substrate holder 20 directly over and surrounding the heating component 50, allowing rapid heating of the supporting surface 22 and the wafer 30. Alternative to the use of the heating component 50, heating can be provided by an external heat flux, such as heat flux from plasma generated in the vacuum chamber 10.

In the cooling phase, the heating component 50 is turned off, the fluid 92 is supplied to the contact volume 90 from the fluid supply unit 140, and the cooling component 60 is activated. When the contact volume 90 is filled with the fluid 92, the heat conductivity across the contact volume 90 is significantly increased, thus providing rapid cooling of the supporting surface 22 and the wafer 30 by the cooling component 60. The small peripheral area 95 (FIGS. 3–5) prevents the fluid 92 from flowing out of the contact volume 90. In some situations, the polished area 95 can be absent, such that the whole areas of the surfaces 93 and 96 are rough. In such situations, either leakage of the fluid 92 from the contact volume 90 can be tolerated or a sealing component (e.g., an o-ring) is used to prevent leakage of the fluid 92.

The present invention can be effectively applied in various systems where efficient temperature control or rapid temperature control is of importance. Such systems include, but are not limited to, systems using plasma processing, non-plasma processing, chemical processing, etching, deposition, film-forming, or ashing. The present invention can also be applied to a plasma processing apparatus for a target object other than a semiconductor wafer, e.g., an LCD glass substrate, or similar device.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A substrate holder for supporting a substrate, comprising:

an exterior supporting surface configured to support said substrate;

a cooling component positioned within an interior of the substrate holder;

a heating component positioned between a side of the substrate holder opposite to the supporting surface and the cooling component; and a contact volume positioned between the heating component and the cooling component, and formed by a first internal surface and a second internal surface, wherein a thermal conductivity between the heating component and the cooling component is increased when the contact volume is provided with a fluid.

2. The substrate holder of claim 1, wherein the supporting surface, an operating surface of the cooling component, an operating surface of the heating component, the first internal surface, and the second internal surface are substantially parallel to one another.

3. The substrate holder of claim 1, wherein a surface area of at least one of the first internal surface and the second internal surface is substantially equal to a surface area of the operating surface of at least one of the cooling component and the heating component.

4. The substrate holder of claim 1, wherein at least one of the first internal surface and the second internal surface is rough.

5. The substrate holder of claim 4, wherein the first internal surface and the second internal surface are in rough contact.

6. The substrate holder of claim 1, wherein at least one of the first internal surface and the second internal surface is smooth.

7. The substrate holder of claim 1, wherein a distance between the first internal surface and the second internal surface is between 1 micron and 50 microns.

8. The substrate holder of claim 1, wherein the cooling component includes a plurality of fluid flow channels.

9. The substrate holder of claim 1, wherein at least one of the first and second internal surfaces includes a plurality of fluid flow grooves and at least one fluid port.

10. The substrate holder of claim 1, wherein the contact volume is sealed within the substrate holder.

11. The substrate holder of claim 1, wherein the fluid used in the contact volume is a gas.

12. The substrate holder of claim 11, wherein the fluid is helium gas.

13. The substrate holder of claim 7, wherein the distance between the first internal surface and the second internal surface is between 1 and 20 microns.

14. The substrate holder of claim 9, wherein the grooves on the two internal surfaces are arranged identically and opposite to each other.

15. The substrate holder of claim 9, wherein the grooves on the two internal surfaces are arranged identically and shifted relative to each other.

16. The substrate holder of claim 9, wherein the grooves on the two internal surfaces are arranged in different configurations.

17. The substrate holder of claim 9, wherein all grooves are connected in a single zone system including at least one port to deliver and remove fluid to and from the grooves.

18. The substrate holder of claim 9, wherein a set of grooves is connected together to form a first zone and at least one other set of grooves is connected together to form a second zone, with no connection between zones, wherein each of the first and second zones includes at least one port configured to deliver and remove fluid to and from the zone.

19. The substrate holder of claim 1, wherein the heating component adjacent to the supporting surface is absent; the heating then is provided by an external heat flux.

20. The substrate holder of claim 1, further comprising at least one thermal sensor.

21. The substrate holder of claim 1, further comprising:

an embedded electrostatic clamping electrode positioned adjacent to the supporting surface and above the contact volume;

connecting elements configured to provide direct current electric potential to the clamping electrode; and a power supply.

22. A substrate holder for supporting a substrate, comprising:

an exterior supporting surface configured to support said substrate;

a cooling component positioned within an interior of the substrate holder;

a heating component positioned within said interior of the substrate holder between a side of the substrate holder opposite to the supporting surface and the cooling component; and first means for effectively reducing a thermal mass of the substrate holder to be heated by the heating component and for increasing thermal conductivity between a portion of the substrate holder surrounding the heating component and a portion of the substrate holder surrounding the cooling component.

23. The substrate holder of claim 22, wherein the first means includes a contact volume positioned between the heating component and the cooling component.

24. The substrate holder of claim 23, wherein the first means includes second means for evacuating a fluid from the contact volume and for providing a fluid to the contact volume.

* * * * *